United States Patent [19]

Gasser

[11] 4,363,289
[45] Dec. 14, 1982

[54] PRINTING SCREEN COATING METHOD AND APPARATUS

[75] Inventor: Rudolf Gasser, Schlieren, Switzerland

[73] Assignee: Firma Ernst Harlacher, Urdorf, Switzerland

[21] Appl. No.: 191,773

[22] Filed: Sep. 29, 1980

[30] Foreign Application Priority Data

Oct. 2, 1979 [CH] Switzerland .......................... 8879/79

[51] Int. Cl.³ .............................................. B05C 3/02
[52] U.S. Cl. .................................... 118/696; 118/404; 118/412; 118/413; 101/128.4
[58] Field of Search ................ 401/265, 266; 118/404, 118/405, 407, 412, 413, 696; 101/128.21, 128.4, 123, 129; 430/308; 427/272, 282

[56] References Cited

U.S. PATENT DOCUMENTS

| | | | |
|---|---|---|---|
| 3,489,592 | 1/1970 | Wallsten | 118/405 X |
| 3,889,629 | 6/1975 | Black | 118/413 X |
| 4,275,655 | 6/1981 | Artaud et al. | 101/123 |
| 4,282,806 | 8/1981 | Lala | 101/123 |

FOREIGN PATENT DOCUMENTS

| | | |
|---|---|---|
| 2733216 | 1/1978 | Fed. Rep. of Germany . |
| 2750690 | 5/1979 | Fed. Rep. of Germany ...... 430/308 |
| 560407 | 3/1975 | Switzerland . |

*Primary Examiner*—John D. Smith
*Assistant Examiner*—Bernard F. Plantz
*Attorney, Agent, or Firm*—Dann, Dorfman, Herrell and Skillman

[57] ABSTRACT

Flat printing screens can be coated on one or both sides by the method and apparatus. A liquid is applied to a screen by one or two squeegees secured to carriages moved up and down on rubber sprocket belts driven by a motor. The speed of application can be adjusted according to the desired thickness of the coating and the viscosity of the liquid. The squeegees are mutually offset somewhat in height to reliably prevent the liquid from running out when the squeegees are not in motion. Application takes place regularly and reproducibly even in the case of a thick coating. The drive by means of rubber sprocket belts and a counterweight ensure vibration-free movement of the squeegees along the screen.

6 Claims, 5 Drawing Figures

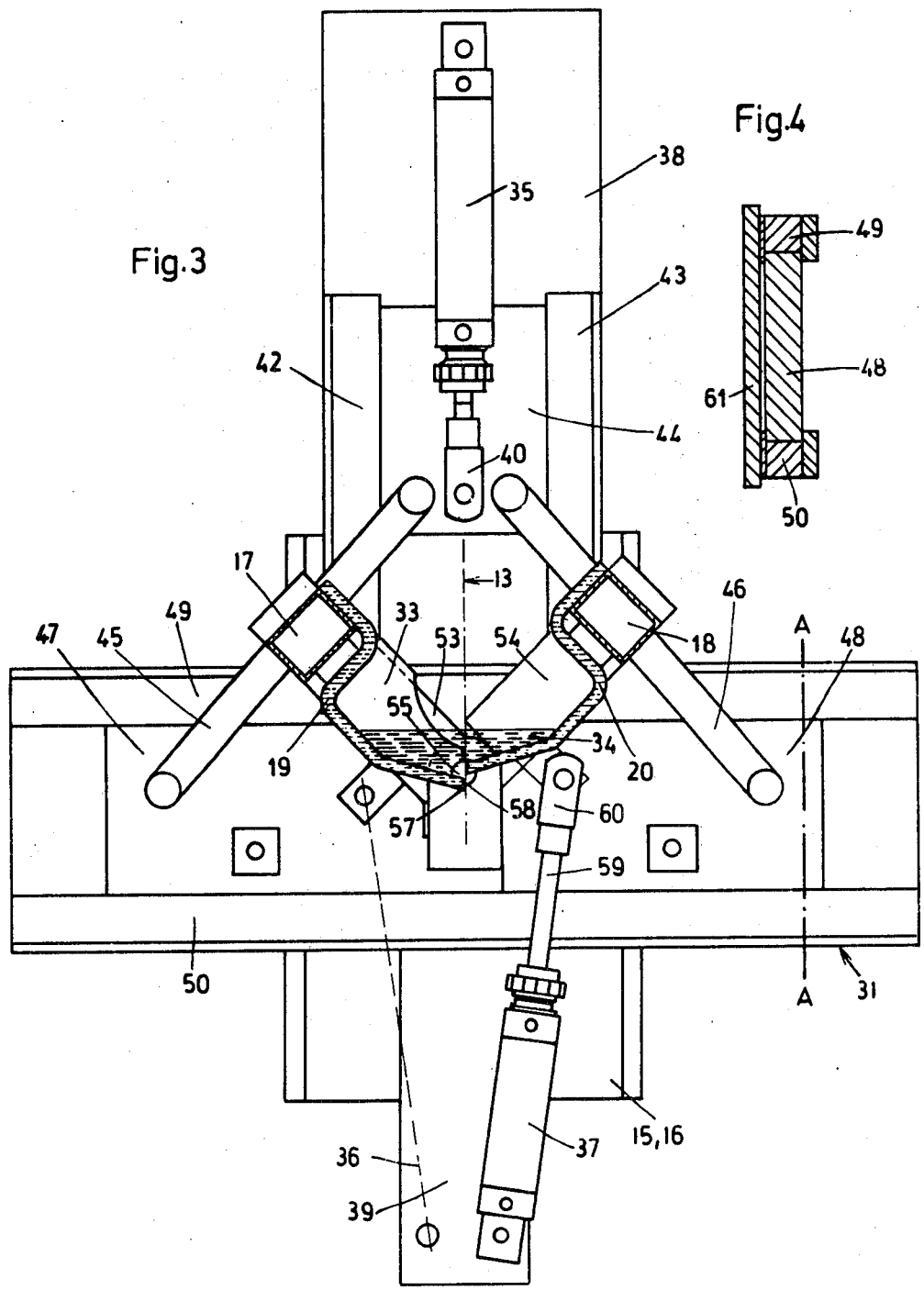

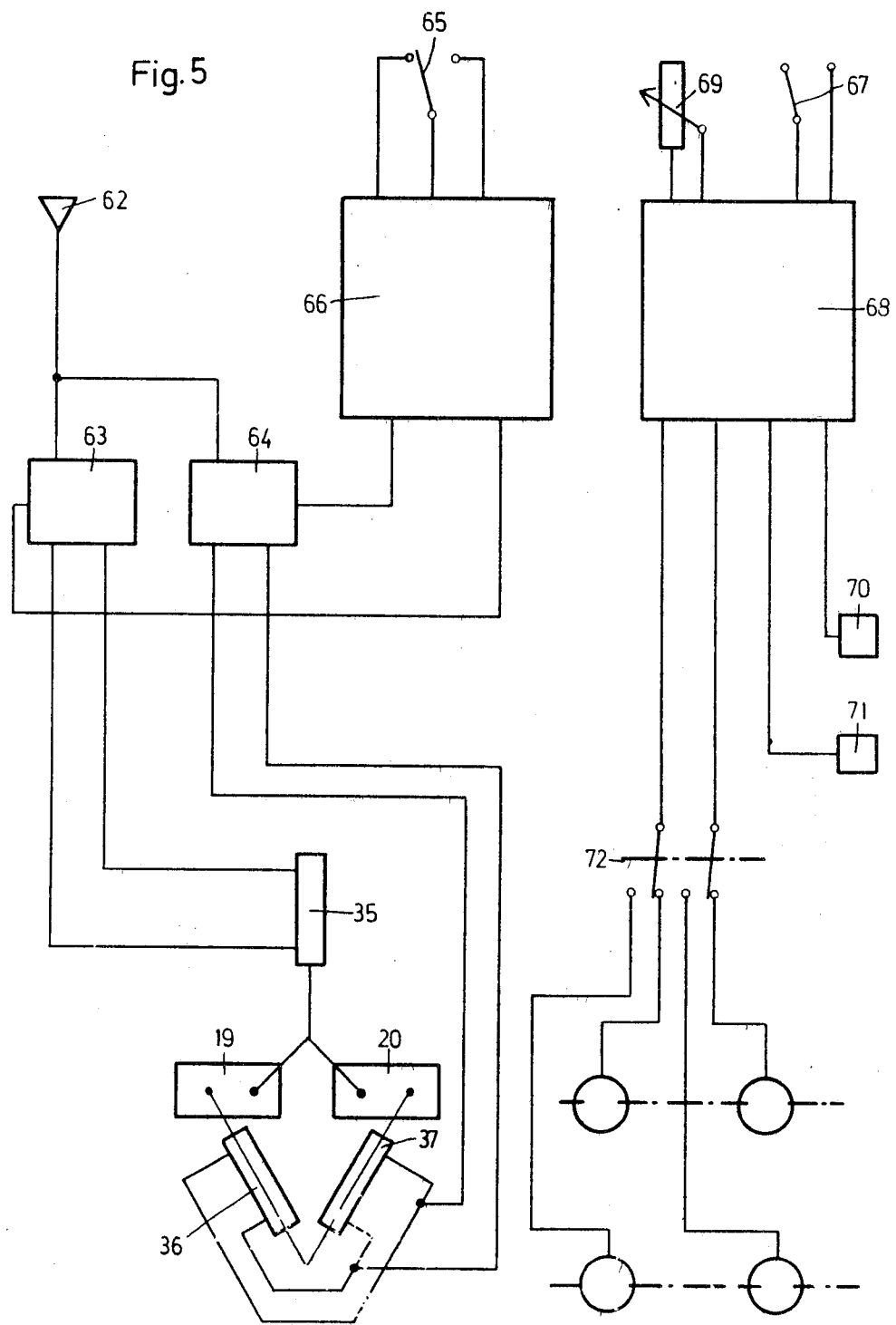

PRINTING SCREEN COATING METHOD AND APPARATUS

This invention relates to screen printing, and more particularly to a method and apparatus for coating a flat printing screen on one or both sides with liquid material, which may be photosensitive material.

In a method taught by Swiss Pat. No. 560,407, an annular receptacle containing liquid material and closed off at the bottom by a collar is moved from top to bottom along a cylindrical stencil to be coated. German Disclosed Application (DOS) No. 2,733,216 describes a similar method of coating a screen cylinder. Methods for coating flat screen stencils on one side by hand with a squeegee are also known.

The methods described in the aforementioned patent specifications are suitable only for coating cylindrical printing stencils. Furthermore, in these prior art methods, the photosensitive emulsion is applied only to the outside. In the case of hand coating, application is very irregular, and what is more, this method requires too great an expenditure of time and effort. When the coating is applied to only one side, the photosensitive emulsion is liable to pass through the screen, so that the lattice becomes evident during the subsequent printing operation.

It is an object of this invention to provide a method and apparatus by means of which flat printing screens or printing stencils can be coated on one or both sides.

A further object of this invention is to provide a method and apparatus whereby photosensitive emulsion can be applied uniformly and reproducibly even at high speeds of application, despite the thickness of the coating.

Still another object of this invention is to provide a method and apparatus which allow the thickness of the photosensitive emulsion coating applied to be varied.

To this end, in the method according to the present invention, either the printing screen or at least one horizontally disposed squeegee containing the liquid material is moved vertically for applying the material to the screen, the movement being automatically controlled.

The apparatus according to the invention for carrying out the foregoing method comprises a mounting support for the printing screen, at least one horizontally disposed squeegee, means for driving either the screen or the squeegee in vertical direction in order to apply liquid material contained in the squeegee, and control means for controlling the vertical movement and the position of the squeegee.

BRIEF DESCRIPTION OF THE FIGURES

A preferred embodiment of the invention will now be described in detail with reference to the accompanying drawings, in which:

FIG. 3 is a view analogous to FIG. 2, showing the squeegees in operating position, FIG. 4 is a section taken on the line A—A of FIG. 3, and FIG. 5 is a block circuit diagram of the apparatus with control means.

DETAILED DESCRIPTION OF THE FIGURES

Figure 1:
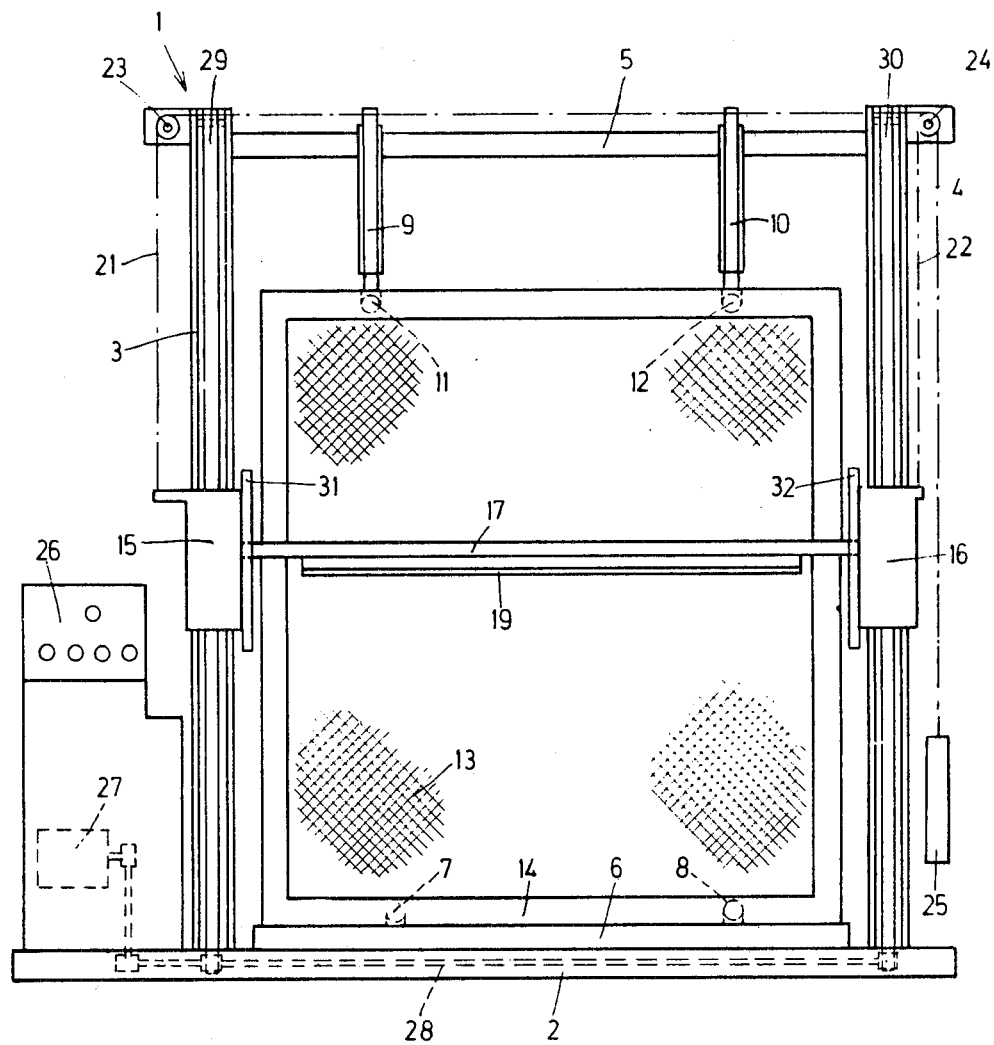
FIG. 1 is an elevation of coating apparatus with a printing screen to be coated.

FIG. 1 shows a frame 1 consisting essentially of a base 2, uprights 3 and 4, and a horizontal top beam 5. Disposed on a rail 6 on base 2 are two magnet holders 7 and 8. Two supports 9 and 10, adjustable in height and provided at their lower ends with further magnet holders 11 and 12, are mounted on beam 5. A printing screen 13 of polyester, nylon, chrome steel, or silk fabric is stretched in a frame 14 which is secured to the four magnet holders 7, 8, 11, 12. Frame 14 with screen 13 might be held in place by mechanical means instead. Two carriages 15 and 16 on rollers are guided for vertical travel on uprights 3 and 4, respectively. Secured between carriages 15 and 16 on each side of screen 13 are crossbars 17 and 18 bearing squeegees 19 and 20, respectively. Cables 21 and 22 are respectively attached to carriages 15 and 16, led over rollers 23 and 24 to a counterweight 25, and secured thereto. In a control console 26, an electric motor 27 for moving squeegees 19 and 20 vertically along screen 13 is accommodated. Via a shaft 28, motor 27 drives two rubber sprocket belts 29 and 30 by means of which carriages 15 and 16 are moved up and down uprights 3 and 4. Disposed on the inner sides of carriages 15 and 16, facing frame 14, are adjusting devices 31 and 32, respectively, for tilting squeegees 19 and 20. The drive by means of rubber sprocket belts 29 and 30, together with counterweight 25, ensures that the movement of squeegees 19 and 20 is free from vibration, a factor which is of great importance in achieving uniform application of photosensitive emulsion to printing screen 13. Magnet holders 7, 8, 11, and 12 make it possible to secure frame 14 rapidly and yet reliably with the fabric stretched therein.

Figure 2:
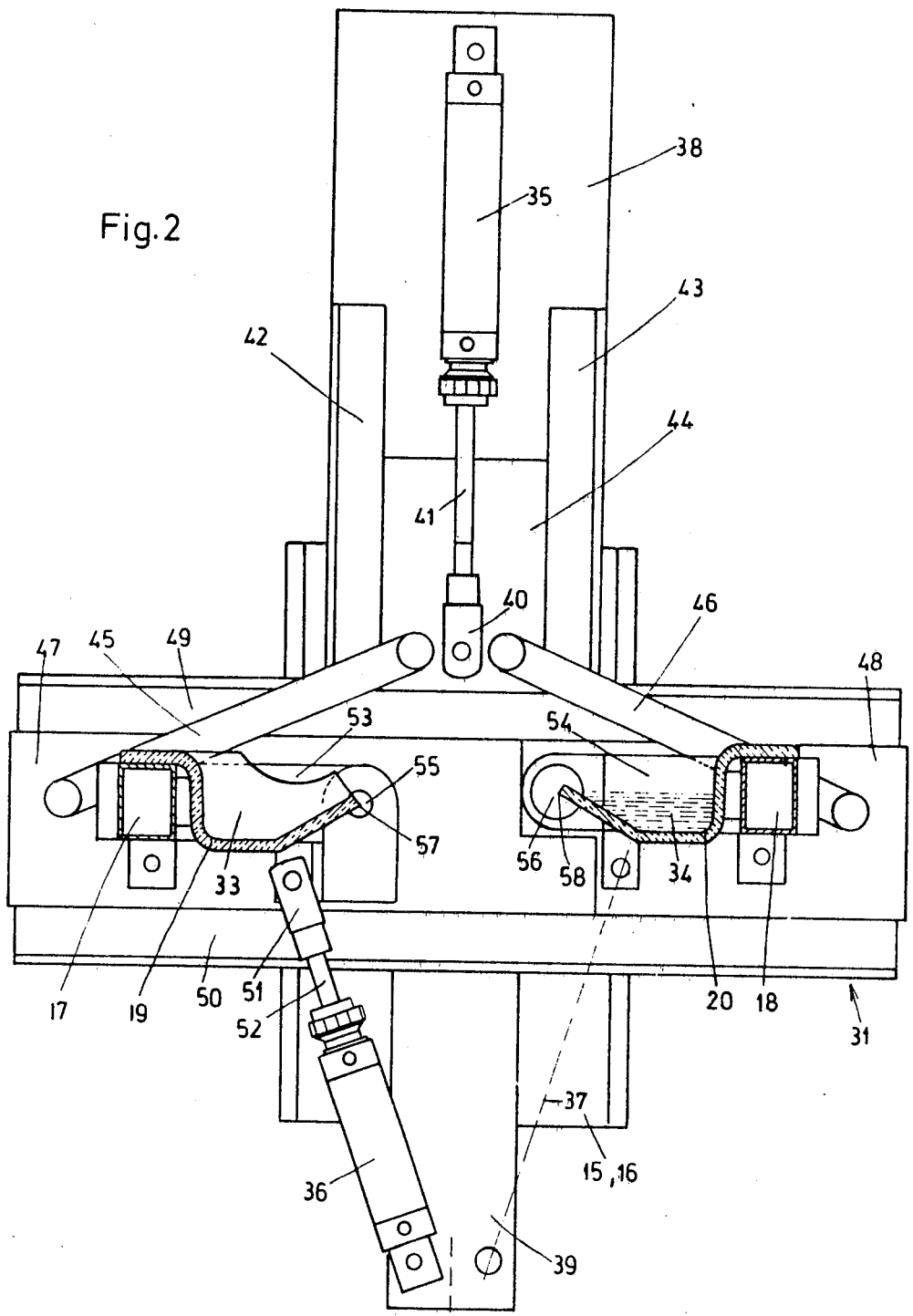
FIG. 2 is a diagrammatic view, partly in section, of a displacing and tilting device with squeegees in rest position.

FIG. 2 shows device 31 affixed to carriage 15 (identical to device 32 affixed to carriage 16) for adjusting squeegees 19 and 20, which are depicted in rest position. In this position, frame 14 with screen 13 can be fixed in the coating apparatus. Photosensitive emulsion 34 is poured into squeegees 19 and 20 as indicated by the level line shown for squeegee 20 at the right in FIG. 2, each of the squeegees being provided with a lateral closure wall 33. The squeegees are tilted from the rest position into the operating position by means of pneumatic cylinders 35, 36, and 37 (cylinder 37, which has the same function as cylinder 36, being indicated only by its axis). Vertical upper cylinder 35 is secured to an upper holding plate 38, the two obliquely disposed lower cylinders 36 and 37 to a lower plate 39. Holding plates 38 and 39 are screwed to carriage 15 (and in like manner to carriage 16). The end 40 of a piston 41 of upper cylinder 35 is connected to a slide 44 guided in rails 42 and 43. Vertical slide 44 is in turn connected via levers 45 and 46 to horizontal slides 47 and 48 guided in rails 49 and 50.

An upward movement of piston 41 causes horizontal displacement of slides 47 and 48 and, consequently, of squeegees 19 and 20, secured to crossbars 17 and 18, inwardly toward screen 13. The upper ends 51 of pistons 52 of lower cylinders 36 and 37 are connected to tilting arms 53 and 54, which are pivoted on pins 55 and 56. The ends 57 and 58 of squeegees 19 and 20 are situated on the pivoting axis of arms 53 and 54. Pins 55 and 56 connect these arms to slides 47 and 48. The right-hand slide 48, as viewed in FIG. 2, has a cut-out portion at the bottom, while the left-hand slide 47 has a cut-out portion at the top, so that pivot pins 55 and 56 can come to lie one above the other when squeegees 19 and 20 are driven toward screen 13. Crossbars 17 and 18 are fixed to tilting arms 53 and 54, the squeegees being screwed to these crossbars.

The front edge 58 of right-hand squeegee 20, as viewed in FIG. 2, is situated some 4 to 10 mm higher than the front edge 57 of the left-hand squeegee 19. For the coating of printing screens to be used in dyeing textiles, edge 58 is situated about 8 mm higher, for electronics applications about 4 mm higher.

FIG. 3 shows the tilting device with squeegees 19 and 20 in operating position. When cylinder 35 is actuated, i.e., when piston 41 is driven in, slides 47 and 48, and hence squeegees 19 and 20 which are still in a horizontal position, are displaced inwardly toward screen 13. When squeegee edges 57 and 58 come in contact with screen 13, tilting arms 53 and 54, which are connected to piston ends 51 and 60, are caused to pivot upward about pivot pins 55 and 56 by actuation of lower pneumatic cylinders 36 and 37, i.e., by driving out pistons 52 and 59. Squeegees 19 and 20 thus reach their operating positions, and emulsion 34 flows to screen 13.

What is important is that the front edges 57 and 58 of the squeegees exactly coincide with the pivoting axes of arms 53 and 54 so that edges 57 and 58, resting against screen 13, will not move and damage the fabric.

FIG. 4, a section taken on the line A—A of FIG. 3, shows slide 48 running within grooved guide rails 49 and 50, which are mounted on a base plate 61.

FIG. 5 is a block diagram of circuitry for controlling the flat-screen coating machine. Compressed air is supplied through a compressed-air pipe-connection 62 to cylinders 35, 36 and 37 via magnetically operated valves 63 and 64. Squeegees 19 and 20, controlled by cylinders 35, 36, and 37, are indicated schematically. A timing control 66 for the operation of the cylinders, i.e., for the inward displacement and upward tilting of the squeegees, is actuated by means of a switch 65. A speed controller 68 is switched on by means of a switch 67. The speed can be adjusted with the aid of a potentiometer 69. The upper and lower end positions of carriages 15 and 16, and thus of squeegees 19 and 20, is limited by upper and lower limit switches 70 and 71. Carriages 15 and 16 can be set for fast or slow travel along uprights 3 and 4 by means of a switch 72, the fast mode being utilized upon termination of the coating operation so that the squeegees return rapidly to their starting positions and frame 14 with screen 13 can be removed from the apparatus. However, the control may also be fully automatic, with selection of a program corresponding to whichever type of coating is desired, for example.

The manner of carrying out the method for coating the flat printing screen will now be explained. Frame 14 with screen 13 is fixed to magnet holders 7, 8, 11, and 12. Squeegees 19 and 20, situated in an outer, horizontal position, are either raised to the top or lowered to the bottom of the apparatus, depending upon which way the emulsion is to be applied. After photosensitive emulsion 34 has been poured into the squeegees, switch 65 is thrown to actuate the timing control 66 for operation of the cylinders. Piston 41 of upper cylinder 35 is driven in, and the squeegees, still horizontal, are displaced inwardly toward screen 13 until they come in contact with it. The one squeegee edge 58 is then situated about 8 mm above the other edge 57. Through actuation of cylinders 36 and 37, pistons 52 and 59 are driven out, whereby the squeegees are tilted upward above pivot points 55 and 56 so that the photosensitive emulsion flows to screen 13. Speed controller 68 is switched on by means of switch 67, and the desired forward speed is set on potentiometer 69. Via shaft 28, motor 27 drives rubber sprocket belts 29 and 30 which move carriages 15 and 16 either upward or downward, depending upon their starting position, at a constant speed. Emulsion 34 is applied to both sides of screen 13. The speed of application must be adjusted according to the desired thickness of the coating of emulsion and the viscosity thereof. Upon termination of the coating operation, the squeegees are pivoted back and horizontally displaced outwardly by means of control 66. By operating switch 72, carriages 15 and 16 can be returned at high speed to their starting positions in order that frame 14 with screen 13 may be removed from the apparatus immediately after the coating operation.

The speed of the two squeegees is generally slower during coating from top to bottom than during coating from bottom to top. During coating from bottom to top, the photosensitive emulsion is also wiped off again to a certain thickness by the squeegees. During coating from top to bottom, some of the emulsion runs back into squeegees 19 and 20 from screen 13. For applying thick coatings, the top-to-bottom direction is more advantageous.

Experience has shown that when the levels of the two squeegees are offset by about 8 mm, the edges of the squeegees need not meet very strict requirements. If the squeegees are situated at differing heights, edges 57 and 58 thereof do not press against one another at the same level. These two edges press the fabric of screen 13 in opposite directions, so that in the vicinity of edges 57 and 58 the fabric does not run in a straight line. As a result, the fabric rests against the edges of the squeegees even where they deviate somewhat from strict alignment. Thus, the photosensitive emulsion is prevented from running downward at those locations where the squeegee edges are not in alignment, and ensuing irregularity of the coating applied is avoided. Another advantage of offsetting the squeegees vertically is that they then glide smoothly, without jerking. Vibration-free travel of carriages 15 and 16, and hence of squeegees 19 and 20, is also very important for the evenness of the emulsion coating applied. This is achieved primarily by designing the drive components as rubber sprocket belts 29 and 30 or as precision chains and by means of counterweight 25.

In order to keep the edges of walls 33 of the squeegees from pressing against one another during application of the coating, one squeegee may be made somewhat shorter than the other.

If coating on only one side is desired, a rod or a roller, for example, may be used instead of the second squeegee. The leading edge of the rod might likewise be offset in height somewhat relative to the squeegee in order to obtain the same advantages as described above.

With prior art methods of coating flat printing screens by hand, it is hardly possible to achieve a uniform, reproducible thick coating. Thick coatings have the advantage of producing a so-called "channel effect." In the printing of textile materials, for example, when part of the pattern occupies an area of the screen containing many crossover points, the dye can also get under these points. With the method described, very high reproducibility of the coating, on the order of about ±1 micron, can be obtained.

A thick coating of printing screen 13 is also advantageous in the manufacture of printed circuits for electronics when thick conductors (for high-intensity currents) are required. The use of coated and exposed printing screens for producing printed circuits represents an important field of application.

Squeegees 19 and 20 are preferably made of aluminum, chrome steel, or plastic. They may be provided with lips or rubber or some other resilient material at the front. Furthermore, the squeegees may be designed with a rounded front profile for applying thick coatings or with a sharp edge for a thin coating. In the case of smaller screens, several squeegees may be disposed next to one another for coating several screens simultaneously.

Instead of squeegees 19 and 20, frame 14 with screen 13 might also be moved vertically either downward or upward, with the squeegees remaining stationary in their vertical position and only their horizontal movement and tilting having to take place. When the screens are to be used for dyeing textiles, a thin, one-time application of photosensitive emulsion from bottom to top is preferable. In the case of very fine patterns, a thick coating will rather be preferred.

The coated screens find further application for printing in relievo in the ceramics industry, where a thick coating, preferably applied from top to bottom, will be used.

What is claimed is:

1. Apparatus for coating both sides of a vertically disposed flat printing screen with liquid material, comprising
    means for holding said screen in a vertical plane,
    two horizontally disposed squeegees, both including container means to contain said liquid material,
    drive means for causing said squeegees to move vertically along opposite sides of said screen and to apply said liquid material from each container means to opposite surfaces of said screen, and
    control means for controlling said drive means.

2. Apparatus according to claim 1 wherein said means to apply said liquid material to said screen includes means to support said squeegees for tilting movement against said screen to cause said liquid material to flow from said container means onto said screen, said control means controlling the rate of vertical movement and thereby the thickness of the coating of the material.

3. Apparatus for coating both sides of a vertically disposed flat printing screen with liquid material, comprising
    means for holding said screen in a vertical plane,
    two horizontally disposed squeegees, both including container means to contain said liquid material, and both having respective front edges facing said screen, said edges being mutually offset in height in order not to press against one another during operation,
    drive means for causing said squeegees to move vertically along opposite sides of said screen and to apply said liquid material from said container means to opposite surfaces of said screen, and
    control means for controlling said drive means.

4. Apparatus for coating both sides of a vertically disposed flat printing screen with liquid material, comprising
    means for holding said screen in a vertical plane,
    two horizontally disposed squeegees, both including container means to contain said liquid material,
    a frame including two uprights,
    two carriages vertically displaceable along said two uprights and connected to said squeegees, drive means comprising a motor, a shaft, and at least one sprocket belt for causing said carriages and said squeegees to move vertically along opposite sides of said screen and to apply said liquid material from said container means to opposite surfaces of said screen,
    control means for controlling said drive means, and
    adjustment means affixed to said carriages for adjusting the positions of said squeegees, including
        a vertical upper cylinder having a piston,
        a vertical slide connected to said piston,
        two crossbars connected to said carriages and bearing said squeegees,
        two horizontal slides connected to said levers for moving said squeegees horizontally,
        two tilting arms secured to said squeegees and pivoted on said horizontal slides, and
        two lower cylinders having pistons connected to said tilting arms for pivoting said tilting arms and thereby tilting said squeegees.

5. Apparatus according to claim 4 wherein said carriages mount said squeegees so that their edges are mutually offset in height in order not to press against one another during operation.

6. Apparatus as in any one of claims 1, 2, 3, 4, or 5 wherein said liquid material is a photosensitive emulsion.

* * * * *